United States Patent [19]
Sferlazzo et al.

[11] Patent Number: 5,497,006
[45] Date of Patent: Mar. 5, 1996

[54] ION GENERATING SOURCE FOR USE IN AN ION IMPLANTER

[75] Inventors: Piero Sferlazzo, Lynnfield; Edward K. McIntyre, Jr., Franklin; William E. Reynolds, Topsfield; Richard M. Cloutier, Salisbury; Thomas N. Horsky, Boxborough, all of Mass.

[73] Assignee: Eaton Corporation, Cleveland, Ohio

[21] Appl. No.: 339,554

[22] Filed: Nov. 15, 1994

[51] Int. Cl.⁶ ..................................................... H01J 37/08
[52] U.S. Cl. ................. 250/427; 250/423 R; 250/442.21
[58] Field of Search ............................... 250/427, 423 R, 250/492.21

[56] References Cited

U.S. PATENT DOCUMENTS

| | | | |
|---|---|---|---|
| 4,017,403 | 4/1977 | Freeman | 250/492 A |
| 4,506,160 | 5/1985 | Sugawara et al. | 250/427 |
| 4,578,589 | 3/1986 | Aitken | 250/492.2 |
| 4,641,031 | 2/1987 | Ito et al. | 250/423 R |
| 4,754,200 | 6/1988 | Plumb et al. | 315/111.81 |
| 5,262,652 | 11/1993 | Bright et al. | 250/427 |

OTHER PUBLICATIONS

Kirchner et al., Nuclear Instruments and Methods, vol. 127, No. 2, Aug. 1975, pp. 307–309.

*Primary Examiner*—Jack I. Berman
*Attorney, Agent, or Firm*—Watts, Hoffmann, Fisher & Heinke Co.

[57] ABSTRACT

An ion source embodying the present invention is for use in an ion implanter. The ion source comprises a gas confinement chamber having conductive chamber walls that bound a gas ionization zone. The gas confinement chamber includes an exit opening to allow ions to exit the chamber. A base positions the gas confinement chamber relative to structure for forming an ion beam from ions exiting the gas confinement chamber. A gas supply is in communication with the gas confinement chamber for conducting an ionizable gas into the gas confinement chamber. A cathode is supported by the base and positioned with respect to said gas confinement chamber to emit ionizing electrons into the gas ionization zone. The cathode comprises a tubular conductive body that partially extends into the gas confinement chamber and includes a conductive cap that faces into the gas confinement chamber for emitting ionizing electrons into the gas confinement chamber. A filament is supported by the base at a position inside the tubular conductive body of the cathode for heating the cap and cause the ionizing electrons to be emitted from the cap into the gas confinement chamber.

19 Claims, 5 Drawing Sheets

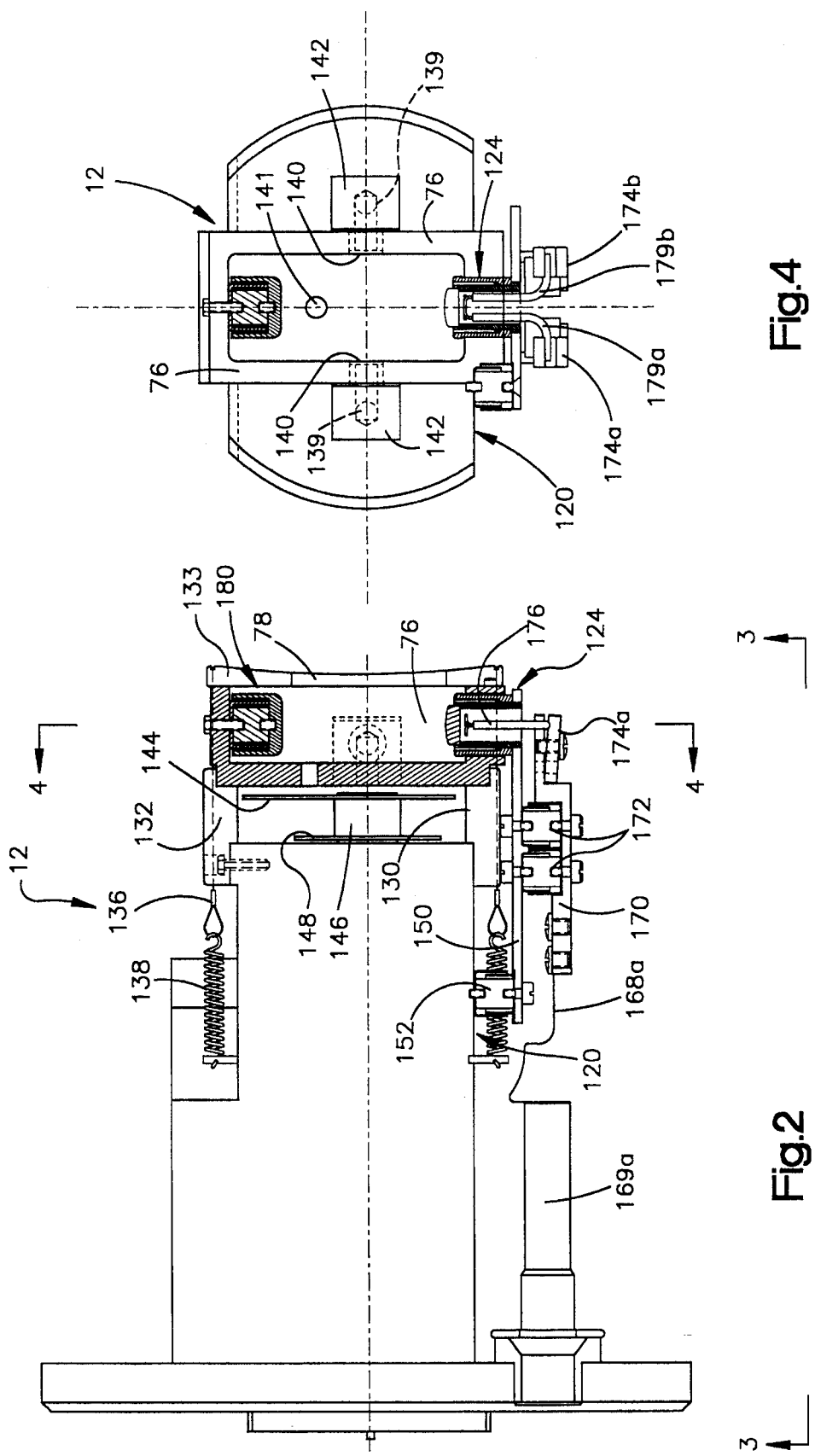

ION GENERATING SOURCE FOR USE IN AN ION IMPLANTER

FIELD OF THE INVENTION

The present invention relates to an ion implanter having an ion generating source that emits ions to form an ion beam for beam treatment of a workpiece.

BACKGROUND ART

Ion implanters have been used for treating silicon wafers by bombardment of the wafers with a beam. The ion beam dopes the wafers with impurities of controlled concentration to yield a semiconductor wafer that in turn is used to fabricate an integrated circuit. One important factor in such implanters is the throughput or number of wafers that can be treated in a given time.

High current ion implanters include a spinning disk support for moving multiple silicon wafers through the ion beam. The ion beam is wide enough to impact an entire wafer surface as the support rotates each wafer through the ion beam.

Medium current implanters treat one wafer at a time. The wafers are supported in a cassette and are withdrawn one at time and placed on a platen. The wafer is then oriented in an implantation orientation so that the ion beam strikes the single wafer. These medium current implanters use beam shaping electronics to deflect a relatively narrow beam from its initial trajectory to selectively dope or treat the entire wafer surface.

Ion sources that generate the ion beams used in the known implanters typically include heated filament cathodes that tend to degrade with use. After relatively short periods of use, the filament cathodes must be replaced so that ions can again be generated with sufficient efficiency. Maximizing the interval between filament cathode replacement increases the amount of time wafers are being implanted and, thus, increases the efficiency of the implanter.

DISCLOSURE OF THE INVENTION

The present invention is directed to an ion implanter using a new and improved ion generating source. The ion generating source of the present invention uses a cathode that shields a cathode filament from the plasma stream. Such shielding has been found to increase the service life of the filament. Furthermore, the construction arrangement of the cathode and filament allow easily and quick replacement or repair to reduce implanter downtime.

An ion source embodying the present invention is most preferably used in an ion implanter. The ion source includes a gas confinement chamber having conductive chamber walls that bound a gas ionization zone. The gas confinement chamber includes an exit opening to allow ions to exit the chamber to form an ion beam. A base positions the gas confinement chamber relative to structure for forming an ion beam from ions exiting the gas confinement chamber. A consumable supply is in communication with the gas confinement chamber for conducting an ionizable material into the gas confinement chamber.

A cathode is supported by the base and positioned with respect to said gas confinement chamber to emit ionizing electrons into the gas ionization zone. The cathode comprises a tubular conductive body that partially extends into the gas confinement chamber and includes a conductive cap that faces into the gas confinement chamber for emitting ionizing electrons into the gas confinement chamber. A filament is supported by the base at a position inside the tubular conductive body of the cathode for heating the cap and cause the ionizing electrons to be emitted from the cap into the gas confinement chamber.

In the preferred embodiment of the invention, the filament is heated to emit electrons to heat the cap which in turn emits electrons into the gas confinement chamber. The base includes a first mounting arm that supports the cathode in spaced relation to the conductive walls of gas confinement chamber. The first mounting arm is supported relative to the base by at least one insulator. The gas confinement chamber has a chamber wall having an access opening sized to allow the tubular conductive body of the cathode to extend into the chamber, thereby positioning the conductive cap within the gas confinement chamber. The tubular conductive body is sized to maintain a gap between an outer surface of the cathode's tubular conductive body and the surface of the chamber body defining the access opening.

The cathode has an open end at a location axially opposite said conductive cap. The filament is mounted to a second mounting arm spaced from the first mounting arm by at least one insulator. The filament extends into the cathode through the open end of the cathode. The filament is located outside of said gas confinement chamber to prevent exposure of the filament to the ionized gas plasma. The ion source further includes a clamp for releasably mounting the filament to said second mounting arm.

The cathode includes coaxially extending inner and outer tubular members that are radially spaced apart along much of their axial extent. The inner tubular member includes a threaded end portion and a shoulder extending radially outward from an exterior surface. The outer tubular member includes a flange extending radially inward for engaging the shoulder of the inner tubular member at one axial end and the first mounting arm at an axially opposite end when the threaded end portion of the inner tubular member is threaded into the first mounting arm. The inner and outer tubular members are made from a molybdenum alloy material. The conductive cap of the cathode is made from a tungsten alloy material.

The ion source further includes a repeller disposed in the gas confinement chamber at a location opposite the cathode. The ion source further includes a lanyard structure for retaining the gas confinement chamber in engagement with a support portion of the base.

BRIEF DESCRIPTION OF THE DRAWINGS

Further features of the present invention will become apparent to those skilled in the art to which the present invention relates from reading the following specification with reference to the accompanying drawings, in which:

FIG. 2 is a partial cross-sectional view of an ion generating source embodying the present invention for creating an ion beam in the implanter of FIG. 1;

FIG. 4 is a partially sectioned view of the ion generating source of FIG. 2, as seen from the plane 4—4 of FIG. 2;

BEST MODE FOR PRACTICING THE INVENTION

Figure 1:
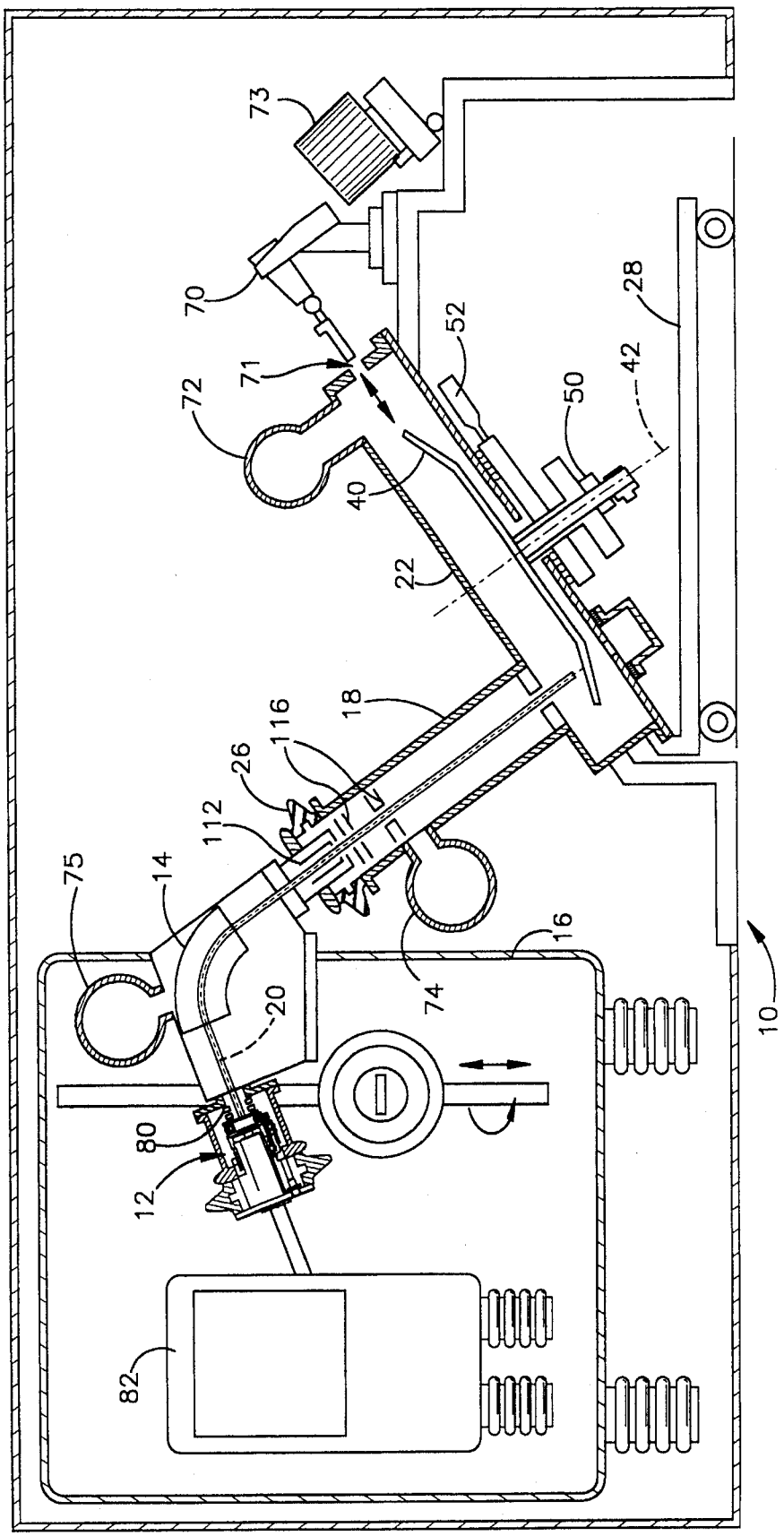
FIG. 1 is schematic view of an ion implanter for ion beam treatment of a workpiece such as a silicon wafer mounted on a spinning support.

FIG. 1 illustrates an ion implantation system 10 having an ion generating source 12 that embodies the present invention and a beam analyzing magnet 14 supported by a high-voltage housing 16. An ion beam 20 emanating from the source 12 follows a controlled travel path that exits the housing 16 travels through an evacuated tube 18 and enters an ion implantation chamber 22. Along the travel path of the ion beam 20 from the source 12 to the implantation chamber 22, the beam is shaped, evaluated and accelerated to a desired implantation energy.

The analyzing magnet 14 causes only those ions having an appropriate mass to reach the ion implantation chamber 22. In the region that the ion beam 20 exits the housing 16, the beam passes through a high-voltage isolation bushing 26 constructed from an electric insulating material that isolates the high-voltage housing 16 from the implantation chamber 22.

The ion implantation chamber 22 is supported on a movable pedestal 28 that allows the implantation chamber to be aligned relative to the ion beam 20. The ion beam 20 impinges upon one or more silicon wafers supported on a wafer support 40 which is mounted for rotation about an axis 42. The wafer support 40 supports multiple silicon wafers around its outer periphery and moves those wafers along a circular path. The ion beam 20 impacts each of the wafers and selectively dopes those wafers with ion impurities. High-speed rotation of the wafer support 40 is effected by a motor 50 which rotates the support 40 and wafers. A linear drive 52 causes the support 40 to be indexed back and forth within the chamber 22. The support 40 is positioned so that untreated wafers can be moved into the chamber 22 and treated wafers withdrawn from the chamber. Additional details concerning prior art ion implantation systems are contained in U.S. Pat. No. 4,672,210 to Armstrong et al. and assigned to the assignee of the present invention, the subject matter of which is incorporated herein by reference.

Silicon wafers are inserted into the ion implantation chamber 22 by a robotic arm 70 through a vacuum port 71. The chamber 22 is evacuated by a vacuum pump 72 to a low pressure equal to the pressure along the evacuated tube 18. The robotic arm 70 transfers wafers back and forth between a cassette 73 for storing the wafers. Mechanisms for accomplishing this transfer are well known in the prior art. Additional vacuum pumps 74, 75 evacuate the ion beam path from the source 12 to the implantation chamber 22.

The source 12 includes a high-density plasma arc chamber 76 (FIGS. 2) having an elongated, generally elliptically shaped exit aperture 78. Additional details concerning one prior art source are disclosed in U.S. Pat. No. 5,026,997 to Benveniste et al. assigned to the assignee of the present invention and which is incorporated herein by reference. As ions migrate from the plasma chamber 76, they are accelerated away from the chamber 76 by electric fields set up by extraction electrodes 80 (FIG. 1) positioned just outside the exit aperture. The analyzing magnet 14 produces a magnetic field that bends ions having the correct mass to an implant trajectory. These ions exit the analyzing magnet 14 and are accelerated along a travel path leading to the implantation chamber 22. An implanter controller 82 is located within the high-voltage housing 16 and adjusts the field strength of the analyzing magnet 14 by controlling current in the magnet's field windings.

The source 12 produces a large fraction of ions having a mass different from the ions used for implantation. These unwanted ions are also bent by the analyzing magnet 14 but are separated from the implantation trajectory. Heavy ions follow a large radius trajectory, for example, and ions that are lighter than those used for implantation follow a tighter radius trajectory.

A Faraday cup (not shown) is positioned along the beam travel path at a location downstream from the magnet 14. The Faraday cup can be moved into the ion beam 20 to intercept ions and prevent them from reaching the implantation chamber 22. The Faraday cup is used during beam set-up to monitor ion beam current. The Faraday cup is also used to intercept ions during other time intervals when ion implantation is suspended, such as when wafers are loaded and unloaded in and out of the chamber 22.

After leaving the magnet 14, the ion beam 20 is focused by a quadrapole lens 112 which is located in the region of the high-voltage isolation bushing 26. The quadrapole lens 112 deflects ions within the ion beam 20 in mutually orthogonal directions to focus the ion beam to an image plane in a manner similar to the focusing effect a convex lens has on light beams. Ions within the beam 20 that are not sufficiently deflected and focused by the quadrapole lens 112 exit from the ion beam and never reach the ion implantation chamber 22. Ions that reach the region of the image plane are accelerated by acceleration electrodes 116 to a desired final implantation energy.

The ion generating source 12 (FIGS. 2–5) embodying the present invention includes a support block 120 that supports the plasma arc chamber 76 and an electron emitting cathode 124. A source magnet 126 (Not Shown) encircles the plasma chamber 76 to confine the plasma generating electrons to tightly constrained travel paths within the chamber 76. The support block 120 also defines cavities that can be filled with vaporizable solids such as arsenic that are vaporized to a gas and then injected into the chamber 76.

Lower and upper spacer supports 130, 132 (FIG. 2) are fixed to the support block 120. The plasma arc chamber 76 is engaged and supported by the lower and upper supports 130, 132 to position the plasma arc chamber relative to the extraction electrodes 80. A plate 133 that defines the exit aperture 78 has top and bottom grooves 134, 135 (FIG. 5) facing the electrodes 80. A pair of lanyards 136, 137 has an intermediate cable portion received in a respective one of the grooves 34, 135 and its axial opposite ends retained by springs 138 connected to the support block 120 to bias and retain the plasma arc chamber 76 against the supports 130, 132.

The arc chamber 76 has conductive walls which define a space in which electrons emitted from the cathode 124 engage gas molecules to generate ions. The ions migrate through the opening 78 and are accelerated by the extraction electrodes 80.

Vaporized material is injected into the interior of the plasma arc chamber 76 from the support block 120 by conduits 139 (shown in phantom) in fittings 142 on opposite sides of the chamber 76. The conduits 139 extend through the fittings to ports 140 that open into the plasma arc chamber 76. Additionally, gas can be directly routed into the chamber 76 by means of a port or opening 141 in a rear wall of the chamber. Immediately behind the chamber 76 in a region bounded by the spacer supports 130, 132 is a heat shield 144 supported by a cylindrical support 146 which is in turn coupled to the mounting block 120. A second heat shield 148 is also connected to the mounting block 120. Appropriately positioned holes in the shields 144, 148 allow conduits to be routed from the support block 120 to the port 141 or the fittings 142.

Figure 5A:
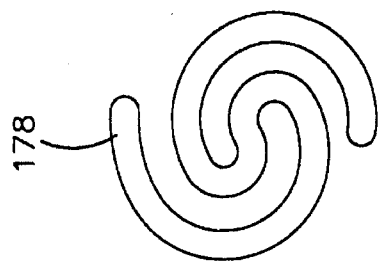
FIG. 5A is a plan view of a filament that forms part of a cathode that emits ionizing electrons.
Figure 3:
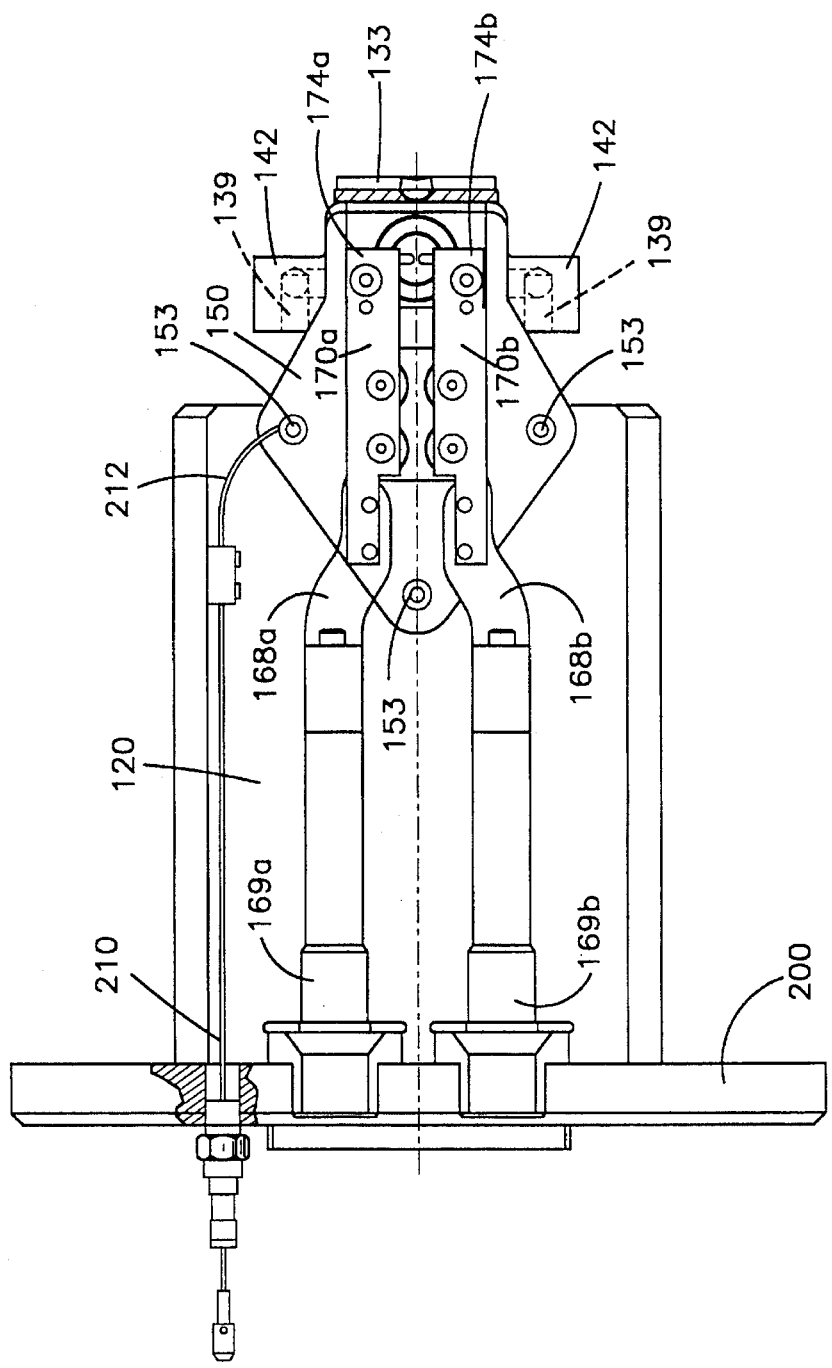
FIG. 3 is a bottom elevation view of the ion generating source of FIG. 2, as seen from the plane 3—3 in FIG. 2.
Figure 5:
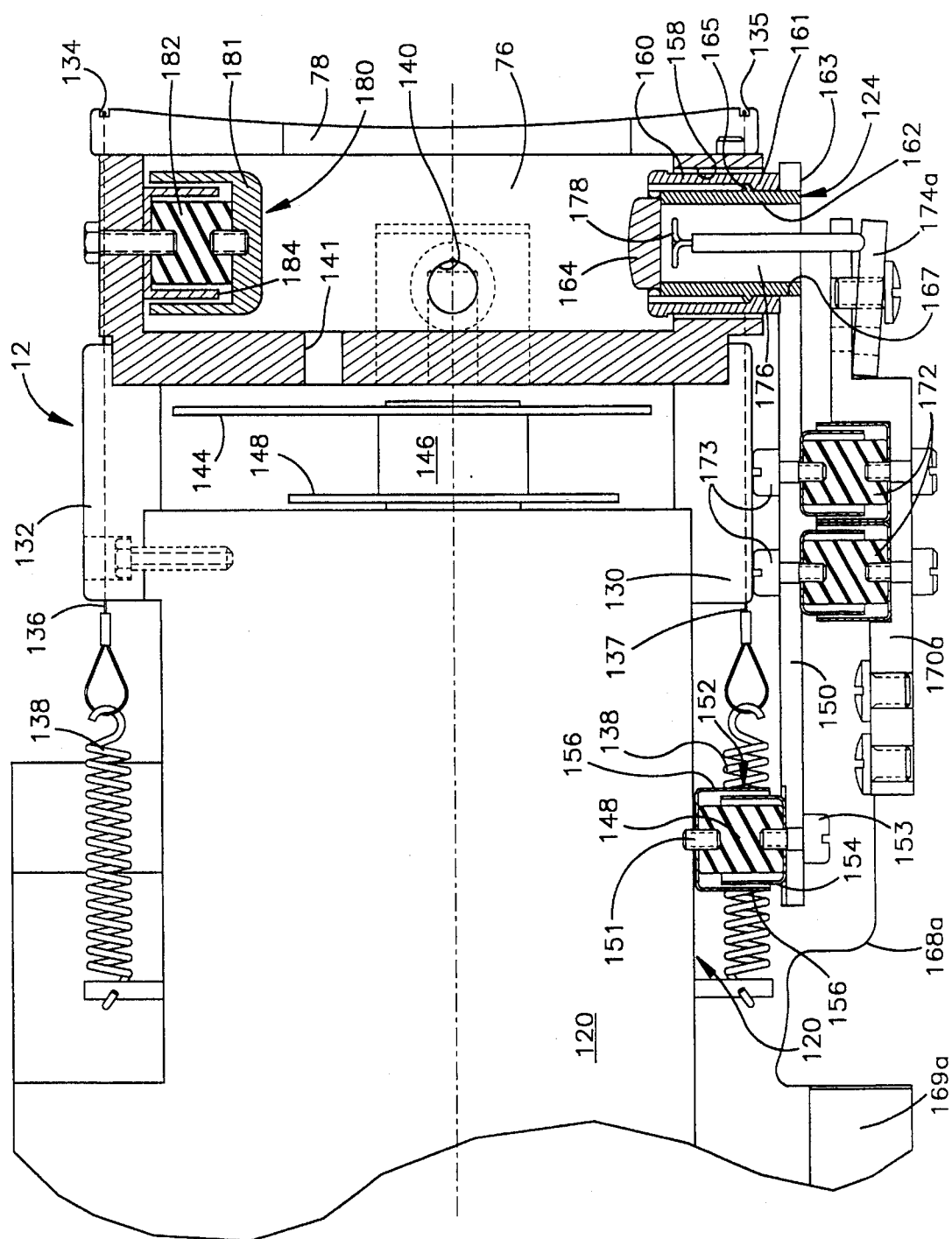
FIG. 5 is an enlarged cross-sectional view of a portion of the ion generating source illustrated of FIG. 2.

The plasma arc chamber 76 has a surface defining an opening 158 in its lower end, as reviewed in FIGS. 2 and 5. The opening 158 is sized to allow the cathode 124 to extend into an interior of the plasma arc chamber 76 without touching the chamber walls that define the opening 158.

The cathode 124 is supported by a mounting plate 150 that is attached to but electrically isolated from the support block 120. The cathode 124 is mounted to the mounting plate 150 by a threaded engagement with the mounting plate 150. Three insulators 152 (FIGS. 3 and 5) connect the mounting plate 150 to the base 120. The insulators 152 are connected to the base 120 by a threaded stud 151 and to the mounting arm 150 by a threaded fastener 153. The insulator 152 includes a ceramic core 148 and two metal shielding cups 154, 156 that prevent ions from shorting across the ceramic core insulator 148 by coating over its outer surface.

The cathode 124 is a three piece member. An outer tubular member 160 of the cathode 124 is made from a molybdenum alloy material having a flange 161 on its lower end that abuts the mounting plate 150. An inner tubular member 162 is also made from a molybdenum alloy material and has a threaded lower end portion 163 and a shoulder 165 intermediate its axial ends. The shoulder 165 engages an upper surface of the flange 161 of the outer tubular member 160 to maintain the flange against the mounting plate 150 when the threaded end portion 163 of the inner tubular member is threaded into a threaded opening 167 in the mounting plate 150. The tubular members 160,162 are preferably cylindrical.

A cap 164 of the cathode 124 is conductive and is made from a tungsten material. The cap 164 fits within a counterbore of an end of the tubular members 162. The counterbore has an inwardly extending ridge having an inner diameter slightly smaller than the diameter of the cap 164. During assembly of the cathode 124 the cap is press fit into the tubular member 162 and frictionally held in place during operation of the ion implanter 10. The length of the inner and outer tubular members 160, 162 is selected so that the cap 164 extends upward into the arc chamber 76.

Two conductive mounting arms 170a, 170b support a filament 178 inside the cathode 124. The arms are mounted in spaced relation to the mounting plate 150 by insulators 172. Conductive filament energizing bands 168a, 168b are coupled to power feedthroughs 169a, 169b to the bands. Opposite ends of the bands are electrically coupled to respective mounting arms 170a, 170b. The ceramic insulators 172 are identical in construction to the insulator 152 except that the threaded stud 151 that connects the insulator to the block 120 is replaced with connectors 173.

Two clamps 174a, 174b fix a tungsten filament 178 within a cavity 176 defined by the innermost tubular member 162 of the cathode. The filament 178 is made of a tungsten wire bent to form a helical loop (See FIG. 5A). Ends of the filament 178 are supported by first and second tantalum legs 179a,179b held in electrical contact with the two arms 170a,170b by the clamps 174a, 174b. When the tungsten wire filament 178 is energized by application of a potential difference across the feed throughs 169a,169b the filaments emit electrons which accelerate toward and impact the cap 164 of the cathode 124. When the cap 164 is sufficiently heated by electron bombardment, it in turn emits electrons into the arc chamber 76 which strike gas molecules and create ions within the chamber 76. An ion plasma is created and ions within this plasma exit the opening 78 to form the ion beam. The use of secondary electron emission from the cap 164 shields the filament from contact with the ion plasma within the chamber and extends the life of the filament. Additionally, the manner in which the filament is supported facilitates replacement of the filament.

Electrons generated by the cathode 124 that are emitted into the arc chamber 76 but which do not engage a gas molecule within a gas ionization zone move to the vicinity of a repeller 180. The repeller 180 includes a metal member 181 located within the arc chamber 76 which deflects electrons back into the gas ionization zone to contact a gas molecule. The metal member 181 is made of molybdenum. A ceramic insulator 182 insulates the repeller member 181 from the electrical potential of the walls of the plasma arc chamber 76. The cathode 124 and repeller 180 are therefore electrically and thermally isolated from the arc chamber walls. Shorting of the repeller member 181 is impeded by a metal cup 184 that prevents ions from coating the insulator 182.

The walls of the chamber 76 are held at a local ground or reference electric potential. The cathode, including the cathode end cap 164 is held at a potential of between 50–150 volts below the local ground of the chamber walls. This potential is maintained by a power feedthrough 210 that energizes a conductor 212 connected to the plate 150. The filament 178 is held at a voltage of between 400 and 1000 volts below the end cap 164. The large voltage difference between the filament and the cathode imparts a high energy to the electrons leaving the filament that is sufficient to heat the end cap 164 and thermionically emit electrons into the chamber 76. The repeller member 181 is allowed to float at the electrical potential of the gas plasma within the chamber 76.

Figure 6:
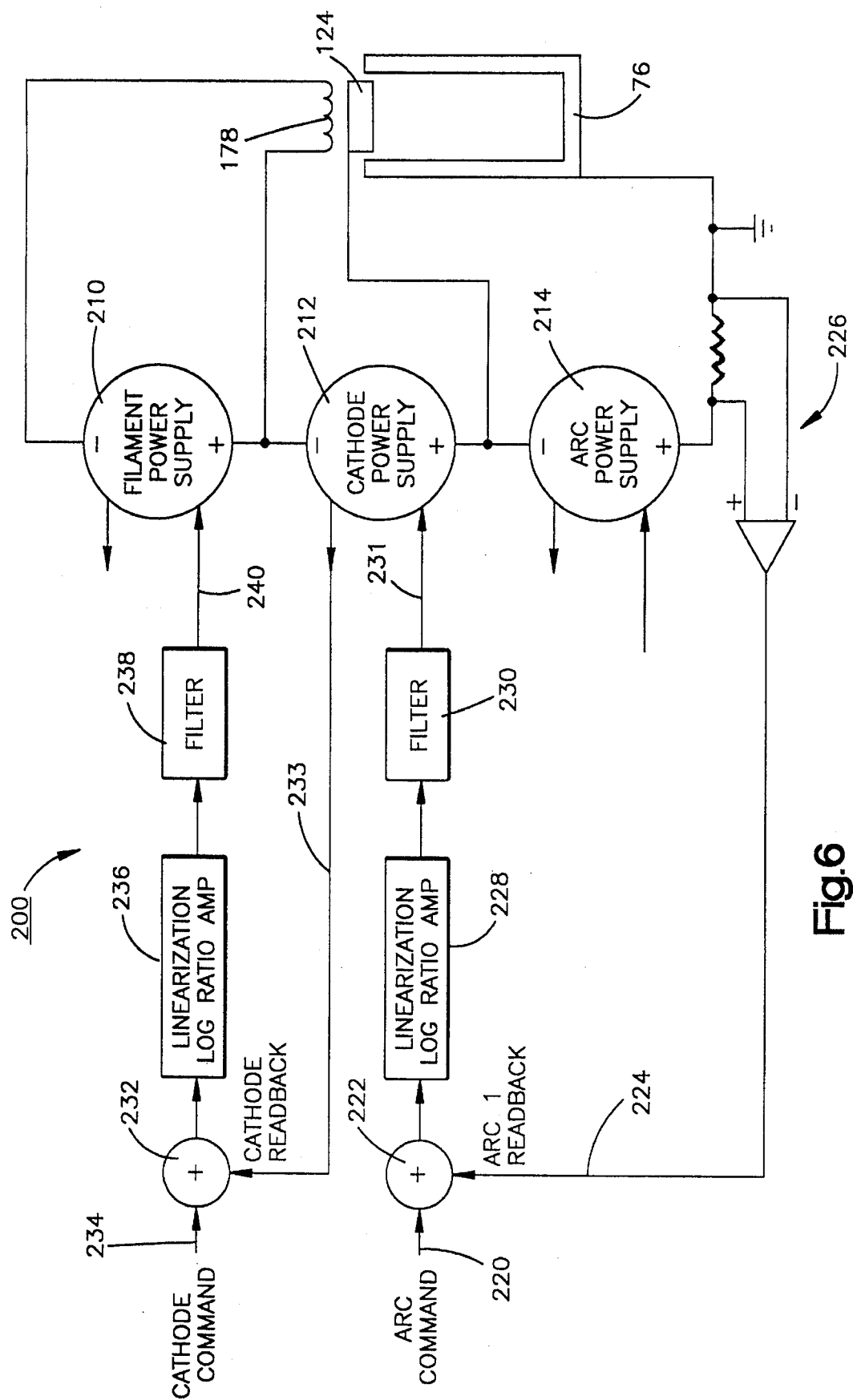
FIG. 6 is a schematic of a control circuit for controlling the arc current flowing between the anode (chamber walls) and cathode (electron source) of the ion source.

FIG. 6 is a schematic showing a circuit 200 that controls arc current between the cathode and the anode (chamber walls). The circuit 200 includes three programmable power supplies 210, 212, 214. A first power supply 210 supplies a voltage across the filament 178 and also provides a feedback signal corresponding to the filament current.

One control variable for the circuit 200 is desired arc current which is supplied at an input 220, The desired arc current has a value determined by an implant controller (not shown) that is based upon desired ion beam current. A comparator 222 compares the desired arc current at the input 220 with a feedback signal 224 from a current sensor 226 that monitors current supplied by an arc power supply 214 that supplies the negative potential (−50 to −150 volts) that energizes the cathode 124. A difference signal from the comparator is amplified by an amplifier 228, filtered by a filter 230 and then fed back to a control input 231 on the power supply 212 that maintains relative potentials between the filament 178 and the end cap 164 of the cathode 128. Increasing this potential difference increases the energy of electrons striking the cap 124 and therefore the arc current density.

The emission current through the cathode 124 is also controlled by means of a current feedback signal 233 from the cathode power supply is coupled to a comparator 232 which compares sensed current with a cathode control current signal coupled to the circuit 200 at an input 234. A difference signal from this comparison is amplified by an amplifier 236 and filtered by a filter 238 and then fed back as a control input 240 to the power supply 210 that supplies the voltage across the filament 178.

From the above description of a preferred embodiment of the invention, those skilled in the art will perceive improvements, changes and modifications. Such improvements, changes and modifications within the skill of the art are intended to be covered by the appended claims.

Having described a preferred embodiment of the invention, we claim:

1. An ion source for use in an ion implanter, said ion source comprising:
   a) a confinement chamber having conductive chamber walls that bound a confinement chamber interior and which defines an ion exit aperture to allow ions to exit the confinement chamber, said confinement chamber further defining an access opening in one of the conductive chamber walls at a location spaced from the exit aperture that allows access to the chamber interior from outside the chamber;
   b) a base for supporting said confinement chamber in a position relative to structure spaced from the confinement chamber for forming an ion beam from ions exiting said confinement chamber through the ion exit aperture;
   c) a supply in communication with said confinement chamber for delivering an ionizable material into the interior of the confinement chamber;
   d) a cathode supported by said base and positioned with respect to said confinement chamber to emit ionizing electrons into the chamber interior for ionizing said material, said cathode comprising a tubular conductive body that extends through the access opening into said confinement chamber and supports a conductive cap at one end that faces into the interior of the confinement chamber and that has an open end at a location axially opposite said conductive cap;
   e) a filament supported by said base at a position inside the tubular conductive body of said cathode for heating said cap to cause the ionizing electrons to be emitted from the conductive cap into said confinement chamber;
   f) a first mounting arm that is spaced from said base by at least one insulator and that supports the cathode within the access opening in a spaced relation to the conductive chamber wall that defines the access opening while positioning the conductive cap in the interior of said confinement chamber: and
   g) mounting structure electrically isolated from the first mounting arm that extends into the open end of said tubular conductive body to support the filament in spaced relation to the conductive cap of said cathode.

2. The ion source of claim 1 comprising a power supply to energize and heat the filament to a temperature to emit electrons to impact said cap and heat said cap to a temperature at which electrons are emitted into the confinement chamber.

3. The ion source of claim 1 further including a two-piece clamp for releasably mounting said filament to said second mounting arm.

4. The ion source of claim 1 wherein said insulators are located outside the confinement chamber and provide electrical and thermal insulation.

5. The ion source of claim 1 further including a repeller disposed in said gas confinement chamber at a location opposite said cathode.

6. The ion source of claim 1 further including a lanyard structure for retaining said gas confinement chamber in engagement with a support portion of said base.

7. The ion source of claim 1 wherein said first mounting arm defines a threaded opening and wherein said cathode includes coaxially extending inner and outer tubular members attached to the first mounting arm by a threaded engagement with the threaded opening in said first mounting arm.

8. The ion source of claim 7 wherein said outer tubular member has a flange on its lower end that abuts the mounting arm and wherein the inner tubular member has a threaded lower end portion and an outwardly extending shoulder intermediate its axial ends, said outwardly extending shoulder engaging an upper surface of the flange of the outer tubular member to maintain the flange against the mounting arm when the threaded end portion of the inner tubular member is threaded into a threaded opening in the mounting arm.

9. The ion source of claim 7 wherein said inner tubular member includes a threaded end portion and a shoulder extending radially outward from an exterior surface, said outer tubular member includes a flange extending radially inward for engaging said shoulder of said inner tubular member at one axial end and the first mounting arm at an axially opposite end when the threaded end portion of said inner tubular member is threaded into the threaded opening in said first mounting arm.

10. The ion source of claim 7 wherein said inner and outer tubular members are made from a molybdenum alloy material.

11. The ion source of claim 1 wherein said conductive cap of said cathode is made from a tungsten alloy material.

12. An ion generating source for use in an ion implantation system, said ion generating source comprising:
   a) a gas confinement chamber having conductive chamber walls that bound a gas ionization zone and defines an exit opening to allow ions to exit the gas confinement chamber;
   b) a base for positioning said gas confinement chamber relative to structure for forming an ion beam from ions exiting said gas confinement chamber;
   c) a supply in communication with said gas confinement chamber for delivering an ionizable material into the gas confinement chamber;
   d) a cathode supported by said base and positioned with respect to said gas confinement chamber to emit ionizing electrons into the gas ionization zone, said cathode comprising a tubular conductive body that partially extends into said gas confinement chamber interior and includes a conductive cap at one end that faces into the gas confinement chamber for emitting ionizing electrons into the gas confinement chamber and has an open end spaced from the conductive cap;
   e) a filament supported by said base that extends into the open end of the tubular conductive body of said cathode for heating the conductive cap to cause the ionizing electrons to be emitted from the conductive cap into said gas confinement chamber; and
   f) a first mounting arm connected to said base for supporting said cathode in a spaced relation to the chamber walls of said gas confinement chamber, said first mounting arm separated from said base by at least one insulator;
   g) mounting structure electrically isolated from the first mounting arm that extends into the open end of said tubular conductive body to support the filament is spaced relation to the conductive cap of said cathode:

h) said gas confinement chamber comprising a chamber wall having an access opening sized to allow said tubular conductive body of said cathode to extend into the access opening and position the conductive cap within the gas ionization zone while maintaining a gap between an outer surface of the tubular conductive body and a surface of the chamber body defining the access opening.

13. The ion source of claim 12 wherein said filament is located outside of said gas confinement chamber to prevent exposure of the filament to ionized gas.

14. The ion source of claim 12 further including a repeller disposed in said gas confinement chamber at a location opposite said cathode.

15. The ion source of claim 12 further including a lanyard structure for retaining said gas confinement chamber in engagement with a portion of said base.

16. The ion source of claim 12 wherein said cathode includes coaxially extending and inner and outer tubular members that are radially spaced apart for substantially all of their respective axial extent.

17. A method of generating an ion beam for treating a workpiece, said method comprising the steps of:

a) providing an ionization chamber that includes an exit opening to allow ions within the ionization chamber interior to exit the chamber to form an ion beam and further has an access opening which opens into an ionization chamber interior;

b) supporting the ionization chamber on a base in relation to beam forming apparatus for directing ions exiting the ionization chamber to a target;

c) supporting a cathode cup having a conductive end cap for emitting electrons into the ionization chamber by inserting the cathode cup through the access opening in a wall of the ionization chamber while maintaining an outer surface of the cathode cup spaced from walls of the ionization chamber that surround the access opening;

d) inserting a filament having an electron emitting portion into an open end of the cathode cup and fixing the filament in spaced relation with the end cap;

e) routing an ionizing material into the ionization chamber;

f) energizing the filament to cause electrons to be emitted;

g) relatively biasing the cathode cup and the filament to cause electrons emitted from the filament to bombard the end cap and induce secondary electron emissions from the end cap into the interior of the ionization chamber to ionize the material routed into the ionization chamber; and h) electrically insulating the filament, the cathode cup and ionization chamber from each other by mounting the cathode to a mounting plate spaced from the base by one or more insulators and mounting the filament to a pair of arms spaced from the mounting plate by insulators.

18. An improved ion implanter including an ion source for generating a beam of ions, an ion beam analyzing magnet for directing ions in a predetermined direction towards an ion implantation chamber having a target support, the ion source including a gas confinement chamber having conductive chamber walls that bound a gas ionization zone and including an exit aperture to allow ions to exit the gas confinement chamber, a base for positioning the gas confinement chamber relative to structure for forming an ion beam from ions exiting the gas confinement chamber, a gas supply in communication with the gas confinement chamber for conducting an ionizable gas into the gas confinement chamber, wherein the improvement comprises:

one wall of the chamber including an access opening through said one wall and a cathode supported by the base and positioned within the access opening to emit ionizing electrons into the gas ionization zone, said cathode comprising a tubular conductive body that is open at one end and includes a conductive cap that extends into the gas confinement chamber for emitting ionizing electrons into the gas confinement chamber;

a filament supported by said base at a position inside the tubular conductive body of said cathode for heating said conductive cap and causing the ionizing electrons to be emitted from the cap into said gas confinement chamber;

a mounting plate connected to said base supporting said cathode in a spaced relation to the conductive chamber walls of said gas confinement chamber;

at least one insulator for electrically isolating the mounting plate from the base; and first and second electrically conductive mounting arms coupled to and electrically isolated from mounting plate that extend into the open end of said tubular conductive body for supporting the filament in spaced relation to the tubular conductive body of the cathode and transmitting energizing signals from a power source to opposite ends of the filament.

19. A three piece cathode for an ion generating source, said cathode comprising:

a) an outer tubular member of the cathode made from a molybdenum alloy material having a flange on its lower end that abuts a mounting plate;

b) an inner tubular member of the cathode made from a molybdenum alloy material having a threaded lower end portion and a shoulder intermediate axial ends of the inner tubular member wherein the shoulder engages an upper surface of the flange of the outer tubular member to maintain the flange against a mounting plate when the threaded end portion of the inner tubular member is threaded into a threaded opening in the mounting plate; and c) a conductive cap made from a tungsten material that fits within a counterbore of an end of the tubular members that is frictionally held in place during operation of the ion generating source; and d) a filament extendable into an open end of one of said tubular members axially opposite said cap for heating said cap to a temperature at which said cap emits electrons, said filament being replaceable and electrically insulated from said tubular members and conductive cap.

* * * * *